(12) United States Patent
Leussler et al.

(10) Patent No.: US 12,631,703 B2
(45) Date of Patent: May 19, 2026

(54) POSITIONING OF RADIOFREQUENCY COILS IN MAGNETIC RESONANCE IMAGING DEVICES

(71) Applicant: KONINKLIJKE PHILIPS N.V., Eindhoven (NL)

(72) Inventors: Christoph Günther Leussler, Hamburg (DE); Steffen Weiss, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 337 days.

(21) Appl. No.: 18/031,170

(22) PCT Filed: Oct. 25, 2021

(86) PCT No.: PCT/EP2021/079506
§ 371 (c)(1),
(2) Date: Apr. 11, 2023

(87) PCT Pub. No.: WO2022/090137
PCT Pub. Date: May 5, 2022

(65) Prior Publication Data
US 2023/0384403 A1 Nov. 30, 2023

(30) Foreign Application Priority Data
Oct. 27, 2020 (EP) ..................................... 20204012

(51) Int. Cl.
G01R 33/34 (2006.01)
(52) U.S. Cl.
CPC ............................. G01R 33/34007 (2013.01)

(58) Field of Classification Search
None
See application file for complete search history.

(56) References Cited

U.S. PATENT DOCUMENTS

| | | |
|---|---|---|
| 5,489,847 A | 2/1996 | Nabeshima et al. |
| 5,552,707 A | 9/1996 | Takahashi |
| (Continued) | | |

FOREIGN PATENT DOCUMENTS

| | | |
|---|---|---|
| DE | 102012206920 A1 | 10/2013 |
| EP | 0338624 A1 | 10/1989 |
| (Continued) | | |

OTHER PUBLICATIONS

International Search Report and Written Opinion From PCT/EP2021/079506 Mailed Jan. 21, 2022.

(Continued)

*Primary Examiner* — Nasima Monsur

(57) ABSTRACT

A system for magnetic resonance imaging includes a magnetic resonance imaging device, and a control unit configured to control the magnetic resonance imaging device. The magnetic resonance imaging device includes a magnetic resonance bore, a movable table configured to be movable in and out of the magnetic resonance bore, and at least two coil elements of at least one coil. The at least two coil elements are adjacently positioned with relative overlap (R) to each other on the movable table. The at least one coil includes an outer cover and an inner core, which is configured to slide laterally in two dimensions within the outer cover. The control unit includes a coil element detecting unit, an overlap detecting unit, a determining unit, and a position adapting unit.

19 Claims, 3 Drawing Sheets

(56)                    References Cited

U.S. PATENT DOCUMENTS

| | | | | |
|---|---|---|---|---|
| 5,917,324 | A | 6/1999 | Leussler | |
| 8,115,483 | B2 | 2/2012 | Biber | |
| 10,509,085 | B2 | 12/2019 | Leussler et al. | |
| 10,653,335 | B2 | 5/2020 | Dohata et al. | |
| 2003/0214300 | A1* | 11/2003 | Bommel | G01R 33/3873 |
| | | | | 324/318 |
| 2008/0211502 | A1 | 9/2008 | Arnold et al. | |
| 2010/0259262 | A1* | 10/2010 | Ichinose | G01R 33/3415 |
| | | | | 324/309 |
| 2013/0307540 | A1* | 11/2013 | Taracila | G01R 33/283 |
| | | | | 324/318 |
| 2014/0055132 | A1* | 2/2014 | Biber | G01R 33/3692 |
| | | | | 324/322 |
| 2015/0025358 | A1* | 1/2015 | Emaci | G01R 33/3415 |
| | | | | 600/411 |
| 2015/0224341 | A1* | 8/2015 | Vahala | A61B 5/055 |
| | | | | 600/411 |
| 2015/0293188 | A1 | 10/2015 | Haider et al. | |
| 2015/0346305 | A1* | 12/2015 | King | G01R 33/5611 |
| | | | | 324/309 |
| 2017/0250953 | A1 | 8/2017 | Jain et al. | |
| 2019/0369181 | A1 | 12/2019 | Chang et al. | |

FOREIGN PATENT DOCUMENTS

| | | | |
|---|---|---|---|
| WO | 2013122483 | A1 | 8/2013 |
| WO | 2014044635 | A1 | 3/2014 |

OTHER PUBLICATIONS http://mriquestions.com/array-coils.html downloaded Apr. 4, 2023.
Constantinides et al "A Phased Array Coil for Human Cardiac
Imaging" Magn. Reson Med. Jul. 1995 vol. 34, p. 92-98.

\* cited by examiner a                  b c d e                  f

POSITIONING OF RADIOFREQUENCY COILS IN MAGNETIC RESONANCE IMAGING DEVICES

CROSS REFERENCE TO RELATED APPLICATIONS

This application is a U.S. national phase application of International Application No. PCT/EP2021/079506 filed on Oct. 25, 2021, which claims the benefit of EP Application Serial No. 20204012.7 filed on Oct. 27, 2020 and is incorporated herein by reference.

FIELD OF THE INVENTION

The present invention relates to a system for magnetic resonance imaging, a method for generating images by magnetic resonance imaging and a program element.

BACKGROUND OF THE INVENTION

High patient throughput is crucial for magnetic resonance imaging devices, in particular in medical facilities. Thus, ensuring a smooth imaging process is of particular importance.

In magnetic resonance imaging devices, radiofrequency coils are commonly used. The radiofrequency coils are configured to excite the magnetization by broadcasting the radiofrequency power as well as to receive the signal from the excited spins. Thus, the radiofrequency coils directly affect the spatial and temporal resolution, sensitivity, and uniformity in magnetic resonance imaging. Therefore, a correct positioning of the receiving coils is crucial for a good image quality. Due to that, usually only trained and experienced staff members are allowed to operate magnetic resonance imaging devices. Understaffing, e.g. due to illness, holidays etc., and/or operating of the magnetic resonance imaging device by unexperienced staff members lead to cancellation and/or delay of the planned schedule. Therefore, the workflows are becoming increasingly autonomous and automated, wherein a correct positioning of the coils is of particular importance.

Wireless radiofrequency coil technology offers convenience and ease of operation for handling and positioning of the coils, in particular for increasingly autonomous and automated workflows. However, the increasingly autonomous and automated workflows rises the challenge of guaranteeing a sufficiently good and constant image quality.

SUMMARY OF THE INVENTION

There may, therefore, be a need for improved positioning of coils in a magnetic resonance imaging device, particularly in case of autonomous and automated workflows. The object of the present invention is solved by the subject-matter of the appended independent claims, wherein further embodiments are incorporated in the dependent claims.

According to a first aspect, there is provided a system for magnetic resonance imaging. The system comprises a magnetic resonance imaging device, and a control unit configured to control the magnetic resonance imaging device. The magnetic resonance imaging device comprises a magnetic resonance bore, a movable table configured to be movable in and out of the magnetic resonance bore, and at least two coil elements of at least one coil. The two coil elements are configured to be adjacently positioned with a relative overlap, and to be relatively movable to each other on the movable table. The control unit comprises a coil element detecting unit configured to detect the at least two coil elements, an overlap detecting unit configured to detect the relative overlap of the at least two coil elements, a determining unit configured to determine whether the detected relative overlap is within a predefined critical range, and a position adapting unit configured to adapt the relative position of the coil elements when the detected relative overlap is outside the predefined critical range.

Such a system for magnetic resonance imaging (MRI) may allow autonomously detecting of and guiding to an optimal relative overlap of the at least two coil elements. The optimal relative overlap may be defined by as a value within a so called "critical range" allowing a fast reconstruction of images and a good image quality. The critical range may be defined by a preset lower limit value and a preset upper limit value between which a homogeneous B1 sensitivity and a good signal-to-noise-ratio may be provided. The predefined critical range may be stored in the control unit.

The homogeneous B1 sensitivity defines the magnetic field sensitivity of the reconstructed image. The homogeneity of the magnetic field is directly proportional to an intensity variation in the image, meaning pixel values in the image. Local variation of B1, meaning varying pixel values in the image, may lead to undesired spatially varying image signals and contrast. Thus, the more homogeneous the B1 sensitivity, the better the image quality.

A good signal-to-noise-ratio may be defined as the independency of the noise from the different coil elements, which may be achieved within the predefined critical range. The signal-to-noise-ratio may be determined using the noise-correlation matrix.

The image quality is dependent on the number of present artifacts. The artifacts can occur due to breathing of a patient and/or due to blood vessels. Hence, those artifacts can hardly be prevented. Additionally, the artifacts can occur due to an unfavorable signal-to-noise ratio. The signal-to-noise ratio corresponds to a measureable value for the presence and intensity of noise due to undesired signal-correlation of adjacently arranged coil elements. Within the predefined critical range, the signal-to-noise ratio is close to an optimum defining a minimal influence on the image quality.

The movable table as used herein is to be understood as a table or a couch, on which a patient is placed at least for the duration of the magnetic resonance image generating process, and may also be referred to as a patient table. The movable table may comprise at least one coil, preferably several coils, embedded into a bed surface of the movable table. The embedded coils may be selectively tuned or detuned by the control unit to achieve the optimal arrangement for the image generating process to be performed.

The at least one coil may be a receiving coil that is usually placed on a patient's body. Additionally or alternatively, there may be applications where a relative overlap of transmit coils, and/or combinations of transmit and receiving coils may be applied. One coil may comprise at least one coil segment comprising several coil elements. The coil elements of one coil segment may be pre-fixedly arranged relative to each other such that an interference of signals of adjacent coil elements is so low that the image quality is barely affected.

The at least two coil elements of at least one coil may relate to coil elements being arranged at outer edge areas of the at least one coil. The coil setup may be dependent on the region to be imaged and/or the individually selected anatomy as well as on a coil size and/or a patient's body size.

The position adapting unit as used herein is to be understood as comprising an audio guidance and/or a video guidance as well as an automated positioning. In other words, the position adapting unit may be configured to support a manual adaption of the coil position, e.g., performed by the patient, by providing an audio guidance, e.g. by an audio output of position adaptation orders and/or an optical guidance, e.g. by displaying the required displacement of the coil, by showing the actual position of the coil and the required position of the coil. Alternatively, or additionally, the position adapting unit may be configured to automatically adapt the position of the coil without a human intervention. In this case, the coil may be provided with software-controlled actuators being controlled by the position adapting unit.

Further, the control unit, particularly the position adapting unit, may be configured to automatically select and detune individual coil elements, especially of wireless radiofrequency coils, to achieve the relative overlap being within the predefined critical range.

Thus, the system may allow patient engagement e.g., through autonomous preparation of the patient by himself without an experienced staff member being physically present. The system may guide the patient through the preparation process, e.g. including the selection of the correct coils and the positioning of the coils such that the relative overlap is within the predefined critical range.

In other words, the system for magnetic resonance imaging may allow an increased patient throughput as the performance is at least less dependent on the presence of a skilled staff member. Further, the system may allow an improved image quality by adapting the relative overlap of adjacently positioned overlapping coil elements to a position in which the signal-to noise-ratio barely affects the image quality.

Additionally, the magnetic resonance imaging device may comprise a computing unit configured to perform an image generating process. In such case, the control unit which in configured to control the magnetic resonance imaging device, controls the computing unit for performing an image generating process.

The control unit may be a state machine capable of machine learning. Machine learning corresponds to a computer-implemented method for accessing and/or collecting data and using the data to learn for themselves. Thus, machine learning is an application of artificial intelligence (AI) enabling systems to automatically learn and improve from experience, e.g. based on collected data, without being explicitly programmed. The control unit may use data from e.g., the coil element detecting unit, the overlap detecting unit, the determining unit and/or the position adapting unit. Additionally, the control unit may have access to a hospital and/or patient database.

According to an embodiment, the at least two coil elements may be from different coils. There may be applications in which the use of more than one coil is required. To ensure a seamless imaging, the at least two coils should be positioned overlapping each other. In such case, the coil elements arranged at the outer edge area of each coil may be positioned overlapping each other. In case of only one coil, the coil may be flexible and wrapped around a part of a patient's body, e.g., a knee, and the coil element of opposing outer edge areas of the coil may be positioned overlapping each other.

According to a further embodiment, the at least one coil may have the form of a flat thin blanket-like pad. Such a coil may be flexible in shape such that the coil may be wrapped around a part of a patient's body as described above. For other application, such a coil may be placed flat onto a part of the patient's body, e.g. on hip, neck or chest. Further, other coil types may be used, e.g. a volume coil, a surface coil etc.

According to an embodiment, the at least one coil may be wireless or non-wireless.

Non-wireless coils may comprise a connection wire to connect the coil with either the control unit or an interface of the computing unit. Non-wireless coil may comprise more than one coil segment to cover a whole body region, e.g. the coil covering a leg may comprise two coil segments. One coil segment may be configured to be placed onto a thigh and the other one may be configured to be placed onto a lower leg, wherein both coil segments may be positioned overlapping each other at the knee. Such coil segments may be at least partially pre-arranged, because all coil segments may be connected to the same connection wire. Wireless coils may simplify coil handling, especially when being placed by an unexperienced person, e.g., the patient himself or an unskilled operator for an autonomous image acquisition.

According to an embodiment, the coil element detecting unit may comprise at least one sensor configured to detect markers of the coils. The sensor may be selected of the 2D-sensor group of optical video sensor, capacitive sensor, and inductive sensor, or the sensor may be selected of the 3D-video sensor group of radar sensor, lidar sensor and infrared sensor.

The coils, particularly the non-wireless coils may comprise optical markers, which can be optical, capacitive or inductive sensible by a corresponding sensor of the coil element detecting unit. The markers may have a predefined position on the respective coil, such that a guidance to achieve a relative overlap within the predefined critical range is provided by the markers being detected by the coil element detecting unit. Additionally or alternatively, the coils, particularly wireless radiofrequency coils, may be equipped with color/sensor coded areas to support the guidance to achieve the relative overlap within the predefined critical range. Further, additionally, an audio device may be individually activated to support the optical guidance.

When using a 3D-video sensor for an external 3D-sensor based guidance to achieve the relative overlap within the predefined critical range, the coils may comprise individual passive or active markers, e.g. regions, to provide contrast for the detection with the 3D-video sensor. The active markers may be modulated and detected by correlation with respect to a reference signal so that active markers may be run with extreme low power requirement.

According to an embodiment, the at least one coil may comprise sensing flexible areas. The flexible areas may be stretchable. By stretching the flexible areas of a coil, the relative overlap between this coil and the adjacently positioned coil may be adapted, particularly by sensing integrated in the flexible areas. The flexible areas may have markers configured to change their distance as function of stretching. The sensing technology integrated in the stretched area may provide a measuring signal for detecting the relative overlap.

Alternatively, the flexible area may be configured as a flexible latch or strap containing flexible coil conductors or coil electronics to realize a guided adaption of the relative overlap. When the relative overlap is detected to be within the predefined critical range, the relative overlap may be fixed using mechanical latches, e.g. Velcro, recess or fixation clamps. The flexible areas may comprise markers to be sensed by the coil element detecting unit. In such case, the stretchable areas may include coil conductor or coil electronics.

According to an embodiment, the magnetic resonance imaging device may further comprise at least one coil holder, configured to hold the at least one coil in a predefined position.

The coil holder may be made for adhering to clothes or may be a harness. The coil may be fixed to the coil holder, preferably with fixations and markers for individual coil positioning detection. The coil holder and/or the coil may be equipped with sensing technology to detect the relative overlap being within the predefined critical range dependent on the individual size of the patient. The coil holder may further be configured to hold the at least one coil in position during the image generating process for preventing a displacement of the coil, particularly a displacement causing the relative overlap moving outside the predefined critical range. The coil holder may be applicable to wireless and non-wireless coils and may be combinable with all position adapting guidance technology mentioned above.

According to an embodiment, the coil may comprise an outer cover and an inner core, which is configured to slide laterally in two dimensions within the outer cover.

The coil may be a surface coil that can be applied to a patient at just approximately correct position manually and then may be fixed, e.g. by the patient himself. The inner core may comprise the coil elements, and be moved relative to the outer cover, by e.g. integrated software-controlled actuators. The inner core may be movable in two lateral, flat dimensions of the surface coil to achieve that the relative overlap is within the predefined critical range. Such coils are of particular use when arranged under a patient's body, or for the coils being integrated in the movable table.

In an embodiment, the at least one coil may further comprise at least one actuator configured to move the inner core at least between a first position without a relative overlap and a second position with the relative overlap.

According to an embodiment, the at least one actuator may be coupled to the control unit, which is configured to control the actuator to move the inner core. The actuator may be driven electrically, pneumatically, or in a similar way. It can either itself have a monitoring device, e.g. a sensor for displacement measurement or the like, and/or be monitored and/or controlled by another monitoring component of the system.

According to a second aspect, there is provided a method for generating images by magnetic resonance imaging. The method comprises the steps of positioning at least two coil elements of at least one coil with relative overlap to each other on a movable table, preferably on a patient's body lying on the movable table, detecting the relative overlap of the coil elements, determining whether the detected relative overlap is within a predefined critical range, repeating the preceding steps, when the detected relative overlap is outside the predefined critical range; and starting an image generating process, when the detected relative overlap is within the predefined critical range and the movable table in a final position for generating images. The method may be at least partly computer-implemented, and may be implemented in software and/or in hardware.

This method may allow autonomously detecting of and guiding to an optimal relative overlap of the at least two coil elements. Thus, the method may allow patient engagement e.g., through autonomous preparation of the patient by himself without an experienced staff member being physically present. The method may guide the patient through the positioning of the coils such that the relative overlap is within the predefined critical range. Therefore, the method may allow an automated and autonomous magnetic resonance image acquisition process ensuring a good image quality.

According to an embodiment, the method may additionally comprise the steps of monitoring the relative overlap of the coil elements during the image generating process, and re-positioning the coil elements during the image generating process, when the monitored relative overlap is detected to be outside the predefined critical range.

Monitoring the relative overlap of the coil elements during the image generating process may allow detecting any change of the relative overlap and therefore, timely reacting to such change. The repositioning of the coil elements during the image generating process may only be applicable when using coils configured to be automatically positioned by the position adapting unit, as the patient may be not allowed to move during the image generating process.

Otherwise, the influence of the displaced relative overlap on the image quality may be estimated, and if necessary, the image generating process may be stopped prematurely, the coil elements may be re-positioned manually and the image generating process may be restarted at the beginning.

According to an embodiment, the step of detecting a relative overlap of the coil elements may comprise determining a noise-correlation-matrix.

The noise-correlation-matrix is a measurement value for the signal-to-noise ratio. The noise-correlation matrix may be acquired by measuring the electrical signals of the individual coil elements. Alternatively, the noise-correlation-matrix may be estimated by an AI-algorithm of the control unit, or by the external 3D-sensing or by coil internal sensing.

The noise-correlation-matrix may be preferably determined by using local and/or distributed transmitters in the movable table, in the coils themselves, or in the bore of the MR system. In case, wireless coils are used, the noise-correlation-matrix and/or a signal coupling may be determined by individual digital transceivers located in a wireless coil. Different coil elements may be individually activated for detecting the relative overlap and to generate a corresponding feedback signal for guiding the positioning of the coil as mentioned above.

According to an embodiment, the step of determining whether the detected relative overlap is within a predefined critical range may comprise comparing the measured noise-correlation-matrix with a predefined noise-correlation-matrix-threshold and based on the comparison result, determining if the detected relative overlap is within the predefined critical range.

The predefined noise-correlation-matrix threshold may differ depending on the area to be imaged. The predefined noise-correlation-matrix may be stored in the control unit and may be adapted by the control unit through a machine learning process.

According to an embodiment, the step of positioning the at least two coil elements may further comprise detecting markers provided on the coil or a coil holder, visually and/or audibly guiding a manual positioning of the coil elements based on the detected position of markers into a position corresponding to a relative overlap within the predefined critical range.

The visual and/or audio guiding process may support the manual positioning of the coil elements and thereby, may accelerate the positioning process.

According to an embodiment, the step of positioning at least two coil elements of at least one coil may further comprise an automatic positioning of the at least one coil based on at least one software-controlled mechanism integrated in the coil.

The automatic positioning of the coils by software-controlled mechanism may comprise the surface coils having an outer cover and an inner core, wherein the inner core is movable within the outer cover, as outlined above. Another software-controlled mechanism for automatically position the coil may comprise the coil being equipped with a crawl-mechanism allowing the coil to crawl on the patient, e.g. guided by the position adapting unit. Once the correct position is achieved, the coil may be fixed in position, e.g. by the patient.

The crawling mechanism may be implemented based on conservation of inertia, e.g. some relatively large mass inside the coil may be first jerked aside laterally and rapidly by an actuator and then moved back more slowly. The conservation of inertia may cause the coils to move during the rapid motion because friction between coil and patient may be exceeded. During the more slowly return motion, the friction may be not exceeded and therefore may hold the coil in place. In other words, fast motion and slow return of the mass being repeated rapidly but at slow amplitude may effectively cause the coil crawling along the patient's body.

According to an embodiment, the method may further comprise the step of moving the movable table in the final position, wherein moving the movable table in the final position is executed after it is determined that the detected relative overlap is within the predefined critical range or while executing the necessary steps to achieve that the relative overlap is within the predefined critical range. Especially, when wireless coils are used, moving the table in the final position may be executed during the positioning of the coils for achieving that the relative overlap is within the predefined critical range.

According to a third aspect, there is provided a program element configured to be stored on a control unit of a system according to first aspect, and configured to cause the system to execute a method according to the second aspect.

It is noted that the above embodiments may be combined with each other irrespective of the aspect involved. Accordingly, the method may be combined with structural features of the system of the other aspects and, likewise, the system may be combined with features described above with regard to the method. Advantageously, the benefits provided by any of the above aspects and examples equally apply to all of the other aspects and examples and vice versa.

These and other aspects of the present invention will become apparent from and elucidated with reference to the embodiments described hereinafter.

BRIEF DESCRIPTION OF THE DRAWINGS

Exemplary embodiments of this disclosure will be described in the following drawings.

The figures are merely schematic representations and serve only to illustrate embodiments of the invention. Identical or equivalent elements are in principle provided with the same reference signs.

DETAILED DESCRIPTION OF EMBODIMENTS

Figures 1, 2, 3:
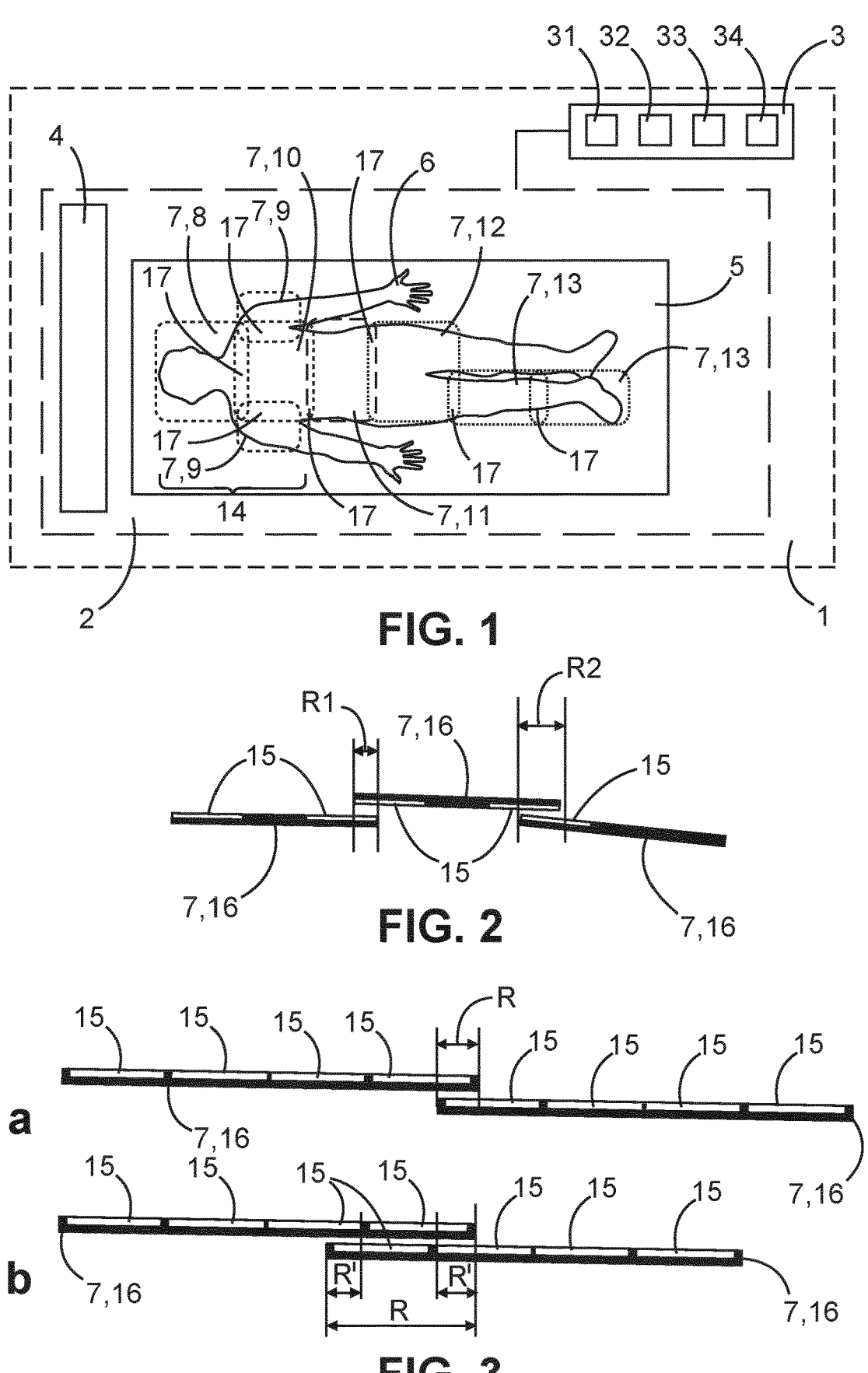
FIG. 1 shows a schematic top view of an exemplary embodiment of a system for magnetic resonance imaging.
FIG. 2 shows a schematic view of an exemplary arrangement of several coils to illustrate exemplary limit values of a predefined critical range.
FIG. 3 shows a schematic cross-sectional view of an exemplary arrangement of two coils having a relative overlap being within the predefined critical range (FIG. 3a), and a schematic view of an exemplary arrangement of two coils having an arbitrary relative overlap (FIG. 3b).

FIG. 1 shows an exemplary embodiment of a system 1 for magnetic resonance imaging in a schematic illustration. The system 1 comprises a magnetic resonance imaging device 2 and a control unit 3, wherein the control unit 3 is configured to control the magnetic resonance imaging device 2.

The magnetic resonance imaging device 2 comprises a magnetic resonance bore 4, a movable table 5 configured to transport a patient 6 in and out of the magnetic resonance bore 4, and several coils 7. In FIG. 1, there are shown exemplarily and schematically a head coil 8, two shoulder coils 9, a neck coil 10, a first anterior coil 11, a second anterior coil 12, and two leg coils 13. Several coils 7 can be grouped, as exemplarily shown by an upper-body-section 14 comprising the head coil 8, the two shoulder coils 9 and the neck coil 10. Combinations of coils 7 may be selected as function of region to be imaged and/or individually selected anatomy.

Each coil 7 comprises several coil elements 15 being fixedly arranged to each other integrated into a coil body 16 (e.g., see FIG. 2). The arrangement of the coils 7, as shown in FIG. 1, illustrates overlapping areas 17, in which adjacently arranged coils 7 overlap with each other. Within the overlapping areas 17, coil elements 15 of the adjacently arranged coils 7 are positioned overlapping each other. Such a relative overlap R (e.g., see FIG. 2) of adjacently arranged coil elements 15 can cause a noise due to inductively coupled signals of the adjacently arranged coil elements 15. This noise directly affects the quality of the reconstructed images of the magnetic resonance imaging device 2, wherein there is a critical range in which the relative overlap R provides a homogeneous B1 sensitivity, and prevents a reduction of the signal-to-noise ratio, resulting in a good image quality.

However, if the relative overlap R is too large or too short, meaning, the relative overlap is outside the critical range, the adjacently arranged coil elements 15 are not optimally inductively decoupled resulting in a signal-to-noise-ratio loss causing image artifacts depending on an image sequence and an image reconstruction algorithm.

Additionally, motion of the patient 6 and/or the coils 7 during the image generating process may negatively affect the image reconstruction, but are difficult to prevent. In combination with a relative overlap being outside the critical range, the image reconstruction may be further complicated, resulting in a bad image quality.

The control unit 3 comprises a coil element detecting unit 31, an overlap detecting unit 32, a determining unit 33 and a position adapting unit 34.

The coil element detecting unit 31 is configured to detect adjacently arranged overlapping coil elements 15. The overlap detecting unit 32 is configured to detect the relative overlap R of the adjacently arranged overlapping coil elements 15. Both units 31, 32 can be provided separately or integrated to each other.

The coil elements 15 may be detected by markers (not illustrated) being provided on the coils 7. The markers can be sensed by the coil element detecting unit 31 and/or the overlap detecting unit 32. The coil element detecting unit 31 and the overlap detecting unit 32 can comprise 2D-sensing technology, sensing optical, capacitive or inductive markers and/or an external 3D-sensing technology to detect passive or active markers providing contrast areas, which can be detected by the 3D-sensing technology, e.g. radar, lidar or infrared sensors.

The determining unit 33 is configured to determine whether the detected relative overlap R being detected by the overlap detecting unit 32 is within the critical range, e.g. by determining an actual noise-correlation-matrix, comparing the actual noise-correlation matrix with a predefined noise-correlation-matrix-threshold, to determine, based on the comparison result, whether the detected relative overlap R is within the critical range. Additionally or alternatively, the determining unit 33 may determine whether the detected relative overlap R is within the critical range based on the results of the overlap detecting unit 32.

The position adapting unit 34 is configured to adapt the relative position of the adjacently arranged overlapping coil elements 15, when the detected relative overlap R is outside the critical range. The position adapting unit 34 can comprise an audio guidance device and/or a video guidance device (not illustrated) for supporting a manual adaption of the coil position, e.g., performed by the patient 6. The audio guidance device can provide an audio guidance, e.g. by an audio output of position adaptation orders and/or the video guidance device can provide an optical guidance, e.g. by displaying the required displacement of the coil 7, by showing the actual position of the coil 7 and the required position of the coil 7.

Additionally or alternatively, the position adapting unit 34 can comprise an automated positioning device configured to automatically adapt the position of the coil 7 without a human intervention. In this case, the coil 7 may be provided with software-controlled actuators being controlled by the position adapting unit 34.

Further, additionally or alternatively, the position adapting unit 34 may be configured to automatically select and detune individual coil elements 15, especially of coil 7 being wireless radiofrequency coils, to achieve the relative overlap R being within the predefined critical range.

FIGS. 2 to 6 show several exemplary embodiments of arranging coils 7 to achieve a relative overlap being within the critical range.

In FIG. 2, three coils 7 each being formed as a thin flat blanket-like pad are arranged such that the coil elements 15 arranged in outer edge areas of the coils 7, are positioned overlapping each other. The thin flat blanket-like coil 7 may be formed of arranging coil elements 15 in arrays (not illustrated), wherein the arrays are fixedly arranged adjacent to each other to form the coil 7. The coil elements 15 shown in FIG. 2, each correspond to one coil element 15 of one coil element array. The relative overlap R1 between a first pair of overlapping coils 7 illustrates a lower limit value for the critical range and the relative overlap R2 between a second pair of overlapping coils 7 illustrates an upper limit value for the critical range defining the range in which the relative overlap R may not negatively affect the image reconstruction.

Whether the relative overlap R is within the critical range may be determined by determining a noise-correlation-matrix. The noise-correlation-matrix, and thereby a signal coupling of adjacently arranged overlapping coil elements 15, can be measured by individual digital transceivers (not illustrated) located in the coils 7.

FIG. 3 shows a schematic cross-sectional view of an exemplary arrangement of two coils 7 being arranged with the relative overlap R. Each coil 7 comprises four arrays of fixedly arranged coil elements 15 embedded in the coil body 16. The coils 7 are formed as wireless radio frequency coils. In FIG. 3a, the relative overlap R is within the critical range whereas in FIG. 3b, the relative overlap R is too large. The coil elements 15 of the wireless radiofrequency coils are configured to be individually tunable, such that in FIG. 3b, an effective relative overlap R' may be achieved by either detuning or deactivating the outer coil element 18 of the upper coil 7 or the outer coil element 18 of the lower coil 7.

Figure 4:
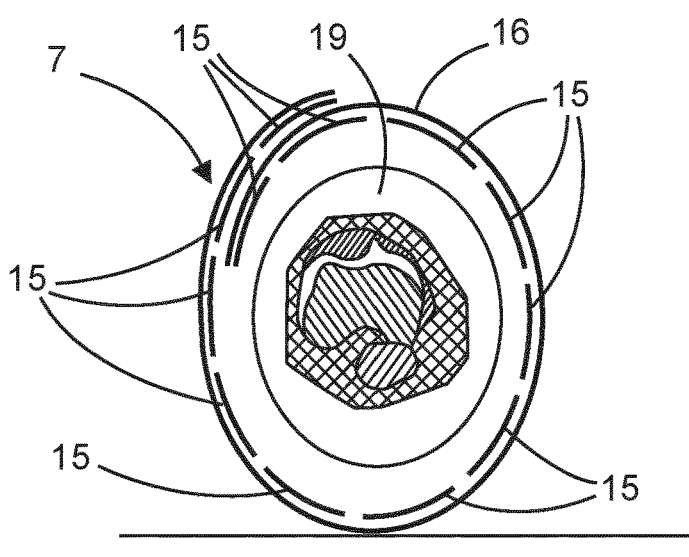
FIG. 4 shows a schematic cross-sectional view of an exemplary embodiment of a coil being wrapped around a knee.

FIG. 4 shows a schematic cross-sectional view of an exemplary embodiment of a coil 7 being wrapped around a knee 19 of the patient 6 (see FIG. 1). The coil 7 corresponds to a wireless radiofrequency coil comprising twelve arrays of fixedly arranged coil elements 15 integrated in the coil body 16. In this illustrated embodiment, the coil elements 15 of only one coil 7 are adjacently arranged overlapping each other. Analogously to FIG. 3B, dependent on the size of the relative overlap R resulting from wrapping the coil around the knee 19, none, one or more coil elements 15 can be deactivated to achieve the relative overlap R being within the critical range.

Figure 5:
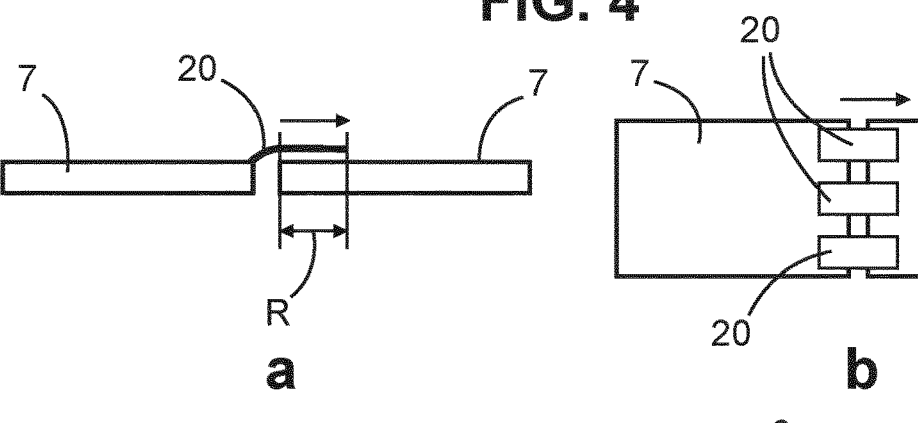
FIG. 5 shows several schematic and exemplary arrangements of coils for achieving a relative overlap.
Figure 5:
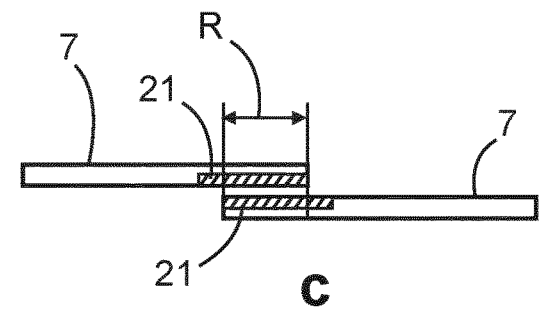
Figure 5:
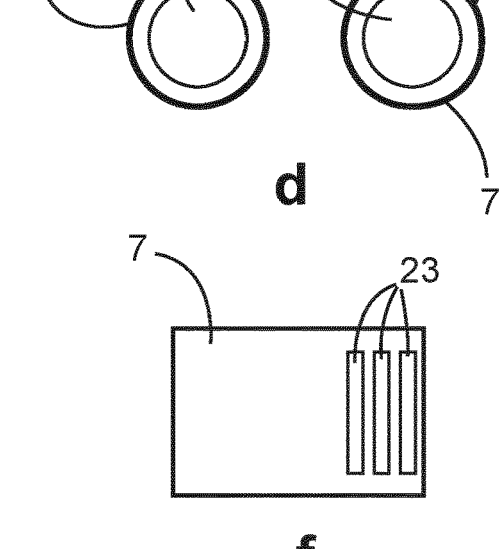
Figure 5:
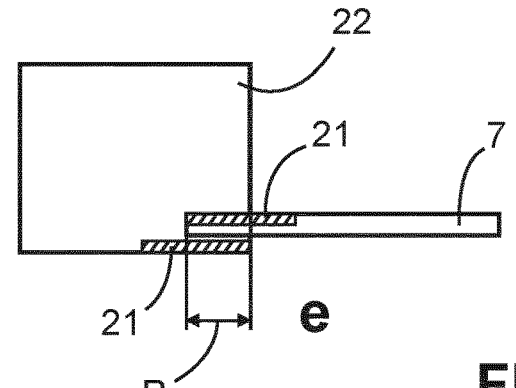

FIG. 5 shows an overview of several schematic and exemplary arrangements of coils 7 for achieving a relative overlap R using different mechanical mechanisms, especially applicable for autonomous positioning of the coils 7 by the control unit 3 (see FIG. 1) and autonomous imaging, as described further below with regard to FIG. 7.

FIG. 5a shows a schematic side view of two adjacently arranged coils 7 and FIG. 5b shows the corresponding top view. According to this exemplary embodiment, the relative overlap R between the two adjacently arranged coils 7 is achieved by providing flexible and/or stretchable latches By stretching the latches 20 of one coil 7 over the adjacently arranged coil 7, the relative overlap R can be generated and aligned to be within the critical range. For this purpose, the latches 20 comprises markers (not illustrated), which change their distance as function of stretching. Thus, the markers functioning as sensor technology 21 (see FIG. 5c) can provide measuring signals, which can be detected by the coil element detecting unit 31 and/or the overlap detecting unit 32 and/or the determining unit 33. Based in the detected signals and the determined relative overlap R, the position adapting unit 34 adapts the position of the latches 20 until the relative overlap R is within the critical range.

FIG. 5c shows a cross-section view of two adjacently arranged overlapping coils 7 each comprising integrated sensing technology 21 to align the relative overlap R to be within the critical range.

FIG. 5d substantially combines the characteristics of the exemplary embodiments shown in FIG. 4 and in FIGS. 5a and 5b. The coil 7 allowing to be wrapped around a patient's body 6 may additionally be stretchable to achieve the related overlap R being within the critical range.

FIG. 5e shows an exemplary embodiment illustrating the combination of a volume coil 22 with a flat, thin blanket-like shaped coil 7. The flat coil 7 may comprise a stretchable area 23 (see FIG. 5*f*). Both coils 7, 22 comprise integrated sensing technology 21 to align the relative overlap R to be within the critical range.

FIG. 5*f* shows a schematic view of an exemplary embodiment of the flat-shaped coil 7 comprising stretchable areas 23 on a surface of the coil 7. The stretchable areas 23 include markers (not illustrated) configured to be sensible for 3D-sensing technology, e.g. provided by the coil element detecting unit 31 and/or the overlap detecting unit 32.

Figure 6:
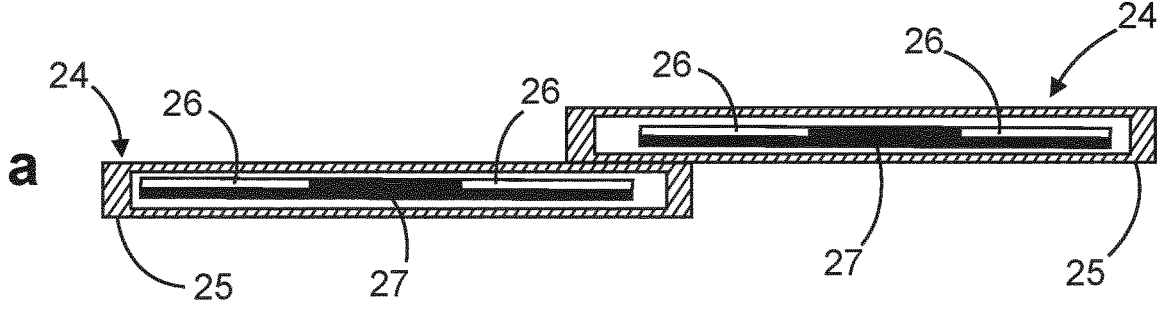
FIG. 6 shows a schematic view illustrating an exemplary embodiment of a surface coil.
Figure 6:
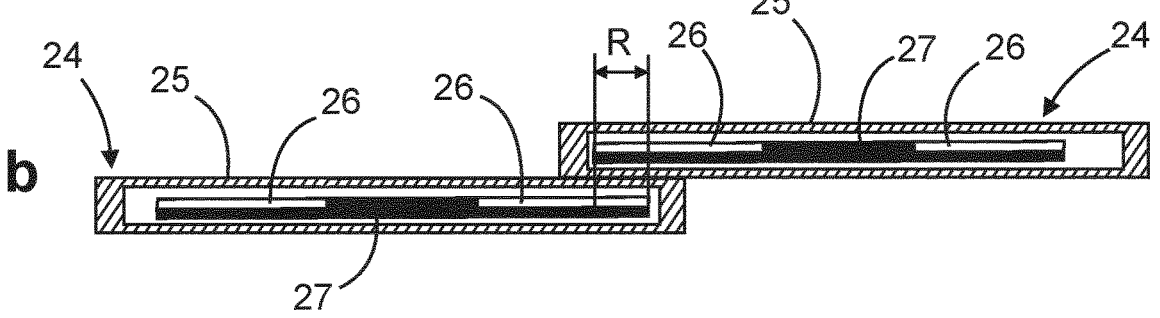

FIG. 6 shows schematic views illustrating an exemplary embodiment of a surface coil 24. The surface coil 24 comprises an outer cover 25, inner cores 26 and actuators 27. The inner cores 26 correspond to the coil elements 15 being arranged inside the outer cover 25 and movable relative to the outer cover 25. The inner cores 26 are moved by the actuators 27, which may be controlled, e.g., by the position adapting unit 34 of the control unit 3. The actuators 27 are controlled such that inner cores 26 of adjacently arranged overlapping surface coils 24 being arranged without a relative overlap (see FIG. 6*a*) are moved to achieve the relative overlap R between the inner cores 26, the relative overlap R being within the critical range (see FIG. 6*b*).

Figure 7:
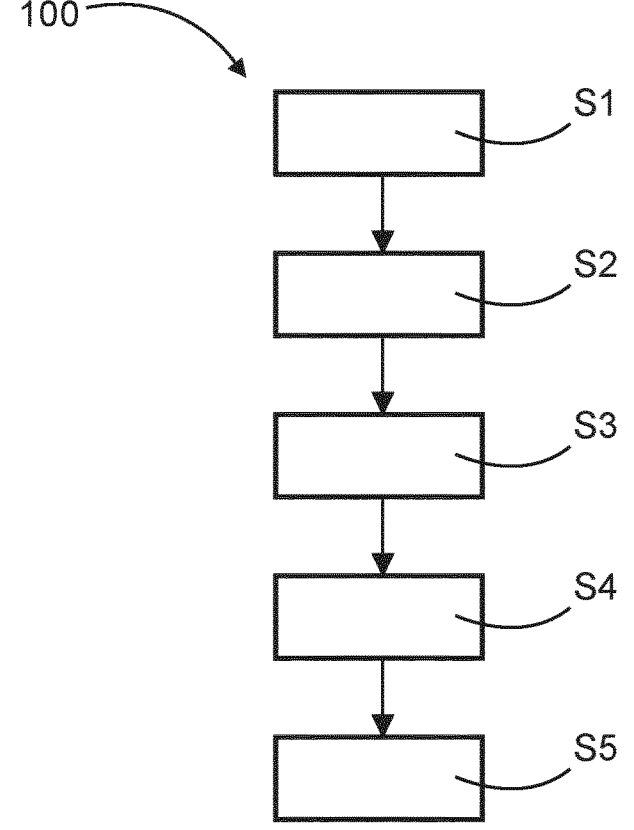
FIG. 7 shows a schematic flow diagram of an exemplary method for generating images by magnetic resonance imaging.

FIG. 7 shows a schematic flow diagram of an exemplary method 100 for generating images by magnetic resonance imaging. The method 100 for generating images by magnetic resonance imaging, comprises the following steps, not necessarily, but preferably in this order. In a step S1, at least two coil elements 15 of at least one coil 7 are positioned with relative overlap R to each other on the movable table 5, e.g. by detecting markers provided on the coil 7 or a coil holder (not illustrated), e.g., through the coil element detecting unit 31 and/or the position adapting unit 34. The positioning may comprise a visual and/or audible guiding of a manual positioning of the coil elements 15 based on the detected position of markers into a position corresponding to a relative overlap R within the predefined critical range. Additionally or alternatively, the positioning may comprise an automatic positioning of the at least one coil 7 based on at least one software-controlled mechanism integrated in the coil 7. In step S2, the relative overlap R of the coil elements 15 is detected, e.g. by measuring a noise-correlation-matrix, preferably by the overlap detecting unit 21. In step S3, it is determined, preferably by the determining unit 33 of the control unit 3, whether the detected relative overlap R is within a predefined critical range, e.g. by comparing the measured noise-correlation-matrix with a predefined noise-correlation-matrix-threshold and based on the comparison result, determining if the detected relative overlap is within the predefined critical range. When the detected relative overlap R is outside the predefined critical range; the steps S1 to S3 are repeated (step S4) until the detected relative overlap R is within the predefined critical range, then an image generating process is started, when the movable table 5 in a final position for generating images (step S5).

The following steps not being illustrated in FIG. 7 may additionally be comprised by the method 100: a step of monitoring the relative overlap R of the coil elements 15 during the image generating process, and a step of re-positioning the coil elements 15 automatically during the image generating process, when the monitored relative overlap R is detected to be outside the predefined critical range.

LIST OF REFERENCE SIGNS 1 system
2 magnetic resonance imaging device
3 control unit
4 magnetic resonance bore
5 movable table
6 patient
7 coil
8 head coil
9 shoulder coil
10 neck coil
11 first anterior coil
12 second anterior coil
13 leg coil
14 upper-body-section
15 coil element
16 coil body
17 overlapping area
18 outer coil element
19 knee
20 latch
21 sensing technology
22 volume coil
23 stretchable area
24 surface coil
525 outer cover
26 inner core
27 actuator
31 coil element detecting unit
32 overlap detecting unit
33 determining unit
34 position adapting unit
100 method
R relative overlap
R' effective relative overlap
R1 lower limit value
R2 upper limit value

The invention claimed is:

1. A system for magnetic resonance imaging, comprising:
a magnetic resonance imaging device, and
a control unit configured to control the magnetic resonance imaging device,
wherein the magnetic resonance imaging device comprises:
    a magnetic resonance bore,
    a movable table configured to be movable in and out of the magnetic resonance bore, and
    at least two coil elements of at least one coil, the at least two coil elements being configured to be adjacently positioned with relative overlap (R) to each other on the movable table, the at least one coil comprising a first coil and a second coil, the first coil comprising a first outer cover and a first inner core corresponding to at least one first coil element of the at least two coil elements, and the second coil comprising a second outer cover and a second inner core corresponding to at least one second coil element of the at least two coil elements, wherein at least one of the first inner core and the second inner core is configured to slide laterally in two dimensions within at least one of the first outer cover and the second outer cover respectively,
wherein the control unit is configured to:
    detect the at least two coil elements,
    detect the relative overlap (R) of the at least two coil elements,
    determine whether the detected relative overlap (R) is within a predefined critical range, and
    adapt the relative position of the coil elements when the detected relative overlap (R) is outside the predefined critical range.

2. The system according to claim 1, wherein the at least two coil elements are from different coils.

3. The system according to claim 2, wherein the at least one coil has a form of a flat thin blanket-like pad.

4. The system according to claim 1, wherein the control unit comprises a coil element detecting unit for detecting the at least two coil elements, and wherein the coil element detecting unit comprises at least one sensor configured to detect markers of the coils, wherein the at least one sensor of the coil element detecting unit is selected of from a 2D-sensor group comprising a optical video sensor, a capacitive sensor, and an inductive sensor, or wherein the at least one sensor of the coil element detecting unit is selected from a 3D-video sensor group comprising a radar sensor, a lidar sensor and an infrared sensor.

5. The system according to claim 1, wherein the at least one coil comprises sensing flexible areas.

6. The system according to claim 1, wherein the magnetic resonance imaging device further comprises at least one coil holder configured to hold the at least one coil in position.

7. The system according to claim 1, wherein at least one of the first coil or the second coil further comprises at least one actuator configured to move at least one of the first inner core or the second inner core at least between a first position without the relative overlap (R) and a second position with the relative overlap (R).

8. The system according to claim 7, wherein the at least one actuator is coupled to the control unit, which is configured to control the actuator to move the at least one of the first inner core or the second inner core.

9. A method for generating images by magnetic resonance imaging, the method comprising:

(a) positioning at least two coil elements of at least one coil with relative overlap (R) to each other on a movable table, the at least one coil comprising a first coil and a second coil, first coil comprising a first outer cover and a first inner core corresponding to at least one first coil element of the at least two coil elements, and the second coil comprising a second outer cover and a second inner core corresponding to at least one second coil element of the at least two coil elements, wherein at least one of the first inner core and the second inner core is configured to slide laterally in two dimensions within at least one of the first outer cover and the second outer cover respectively;

(b) detecting the relative overlap (R) of the coil elements;

(c) determining whether the detected relative overlap (R) is within a predefined critical range;

(d) repeating steps (a) to (c), when the detected relative overlap (R) is outside the predefined critical range; and (e) starting an image generating process, when the detected relative overlap (R) is within the predefined critical range and the movable table is in a final position for generating images.

10. The method according to claim 9, additionally comprising (f) monitoring the relative overlap (R) of the coil elements during the image generating process, and (g) re-positioning the coil elements during the image generating process, when the monitored relative overlap (R) is detected to be outside the predefined critical range.

11. The method according to claim 9, wherein detecting a relative overlap (R) of the coil elements comprises determining a noise-correlation-matrix.

12. The method according to claim 11, wherein the determining whether the detected relative overlap (R) is within a predefined critical range comprises comparing the determined noise-correlation-matrix with a predefined noise-correlation-matrix-threshold and based on a result of the comparison, determining if the detected relative overlap (R) is within the predefined critical range.

13. The method according to claim 9, wherein positioning the at least two coil elements further comprises detecting markers provided on the at least one coil or a coil holder, visually and/or audibly guiding a manual positioning of the coil elements based on the detected position of markers into a position corresponding to a relative overlap (R) within the predefined critical range.

14. The method according to claim 9, wherein positioning the at least two coil elements of the at least one coil, further comprises an automatic positioning of the at least one coil based on at least one software-controlled mechanism integrated in the at least one coil.

15. The method according to claim 9, wherein at least one of the first coil or the second coil further comprises at least one actuator configured to move at least one of the first inner core or the second inner core at least between a first position without the relative overlap (R) and a second position with the relative overlap (R).

16. The method according to claim 15, wherein the at least one actuator is coupled to the control unit, which is configured to control the at least one actuator to move the at least one of the first inner core or the second inner core.

17. The method according to claim 9, further comprising moving the movable table in the final position after it is the detected relative overlap is determined to be within the predefined critical range or while executing steps to achieve that the detected relative overlap is within the predefined critical range.

18. A program element configured to be stored on non-transitory computer readable medium of a control unit of a magnetic resonance imaging system wherein execution of the program element causes the system to:

(a) position at least two coil elements of at least one coil with relative overlap (R) to each other on a movable table, the at least one coil comprising a first coil and a second coil, the first coil comprising a first outer cover and a first inner core corresponding to at least one first coil element of the at least two coil elements, and the second coil comprising a second outer cover and a second inner core corresponding to at least one second coil element of the at least two coil elements, which comprises the wherein at least one of the first inner core and the second inner core is configured to slide laterally in two dimensions within at least one of the first outer cover and the second outer cover respectively;

(b) detect the relative overlap (R) of the coil elements;

(c) determine whether the detected relative overlap (R) is within a predefined critical range;

(d) repeat (a) to (c), when the detected relative overlap (R) is outside the predefined critical range; and (e) start an image generating process, when the detected relative overlap (R) is within the predefined critical range and the movable table is in a final position for generating images.

19. The program element according to claim 18, wherein execution of the program element causes the system to:

(f) monitor the relative overlap (R) of the coil elements during the image generating process, and (g) re-position the coil elements during the image generating process, when the monitored relative overlap (R) is detected to be outside the predefined critical range.

* * * * *